United States Patent [19]
Katsura

[11] Patent Number: 5,412,334
[45] Date of Patent: May 2, 1995

[54] SEMICONDUCTOR INTEGRATED CIRCUIT DEVICE HAVING DYNAMIC CIRCUITS WITH FLOATING GATES

[75] Inventor: Joji Katsura, Nishinomiya, Japan

[73] Assignee: Matsushita Electric Industrial Co., Ltd., Kadoma, Japan

[21] Appl. No.: 183,799

[22] Filed: Jan. 21, 1994

Related U.S. Application Data

[63] Continuation of Ser. No. 973,607, Nov. 6, 1992, abandoned, which is a continuation of Ser. No. 725,295, Jul. 3, 1991, abandoned.

[30] Foreign Application Priority Data

Jul. 4, 1990 [JP] Japan ..................... 2-178210

[51] Int. Cl.$^6$ ............... H03K 17/16; H03K 3/00; G11C 19/00
[52] U.S. Cl. ................... 327/387; 327/389; 327/391; 327/291; 377/64; 377/78; 377/79
[58] Field of Search .............. 307/571, 582, 583, 584, 307/585, 269, 451, 443, 452, 453, 480; 377/64, 68, 72, 73, 74, 78, 79

[56] References Cited

U.S. PATENT DOCUMENTS

| | | | |
|---|---|---|---|
| 4,777,623 | 10/1988 | Shimazu et al. | 307/571 |
| 4,961,015 | 10/1990 | Shin et al. | 307/571 |
| 5,019,731 | 5/1991 | Kobayashi | 307/571 |

Primary Examiner—Timothy P. Callahan
Assistant Examiner—Trong Phan
Attorney, Agent, or Firm—Willian Brinks Hofer Gilson & Lione

[57] ABSTRACT

In the semiconductor integrated circuit device of the present invention which includes at least one dynamic circuit having one or more floating gates in a static state, a switching circuit is provided either between the floating gate and a power source or between the floating gate and the ground which is driven by a clock signal input to the dynamic circuit and sets the potential of the floating gate at a predetermined value in the static state of the dynamic circuit.

10 Claims, 4 Drawing Sheets 5,412,334

SEMICONDUCTOR INTEGRATED CIRCUIT DEVICE HAVING DYNAMIC CIRCUITS WITH FLOATING GATES

This is a continuation application of application Ser. No. 07/973,607, filed Nov. 6, 1992, now abandoned, which in turn is a continuation of application Ser. No. 07/725,295, filed Jul. 3, 1991, now abandoned.

BACKGROUND OF THE INVENTION

1. Field of the Invention

The present invention relates to a semiconductor integrated circuit device that includes a dynamic circuit having one or more gates floating in the static state, which utilizes a switching circuit for securing the potential of the floating gates.

2. Description of the Related Art

When measuring a source current in the static state in a semiconductor integrated circuit device having one or more gates floating in the static state, for example, in a microprocessor having many logic circuits for dynamic operation, test pattern signals are impressed from outside pins for initialization of a register, etc. for every functional module of the whole chip, and then data is set in a manner to remove steady leak as much as possible between the power source and ground. However, many dynamic circuits are unable to settle potentials in the static state. FIG. 5 illustrates an example of the structure of a conventional two-phase dynamic MOS shift register used in the semiconductor integrated circuit device referred to above. In FIG. 5, reference numeral Q1 to Q6 indicate MOS transistors, $\phi1,\phi2$ indicate clock signals, and 30 is a two-phase dynamic MOS shift register. The circuit structure indicated in FIG. 5 has often been used because of its simplicity and operating capability with a higher clock frequency to catch up with the speed-up of the operating frequency of the semiconductor integrated circuit device. In the circuit structure shown in FIG. 5, however, in the static state where clock signals are stopped, the clock signals $\phi1,\phi2$ are both "0" (low level), thereby turning the transistors Q1,Q2 off, with no data input from an input terminal IN1. Therefore, nodes 2,3 connected respectively with gates of transistors Q3,Q4 and gates of transistors Q5,Q6 are brought into the floating state. As a result, the potentials of the nodes 2,3 are not secured, bringing the transistors Q3,Q4 and Q5,Q6 into unstable states between on and off and, causing a leak current dependent on the potentials of the gates.

As mentioned above, when the operating current is to be measured in the static state of the semiconductor integrated circuit device, a desired data is written into a latch circuit or the like through initialization of a register, etc. while suppressing the steady leakage of current as much as possible between the power source and ground. To aim to completely remove the leak, however, requires considerable amount of effort and labor to form a test pattern for setting the desired data.

Moreover, when a dynamic circuit having one or more floating gates in the static state is present within the semiconductor integrated circuit device, the measurement of the static source current becomes unstable without reproducibility. Accordingly, since it is impossible to avoid the floating of the gate in the static state even if any test pattern is impressed from the outside pins, many dynamic circuits in the semiconductor integrated circuit device would in some cases invite a decrease of the source voltage of the chip due to a large increase of the total leak current. It is strongly desired to measure a correct value of the source current and to solve the decrease of the source voltage due to the temporary increase of current. Although it may be arranged to add a feedback latch circuit thereby to change the dynamic circuit to a static circuit for settlement of the gate potential, this requires a large area for the gate, and the merits of the dynamic circuit, namely, high-speed operation, cannot be fulfilled.

SUMMARY OF THE INVENTION

An essential object of the present invention is to provide a technique, with an aim to solve the above-discussed disadvantages inherent in the prior art, whereby the potential of each node connected with gates of each dynamic circuit in the static state is secured by a switching circuit.

In accomplishing the above-described object, according to the present invention, a semiconductor integrated circuit device including at least one dynamic circuit having gates floating with unsecured potentials in the static state is provided either between each floating gate and the power source or between each floating gate and the ground with a switching circuit which is driven by a clock signal input to the dynamic circuit, so that the potential of the floating gate is secured at a predetermined level in the static state.

According to the arrangement of the present invention as described above, in a semiconductor integrated circuit device such as a microprocessor or the like including many dynamic circuits, the switching circuit is driven by a clock signal input to each dynamic circuit, thereby securing the potential of the node from the floating state to a predetermined potential state.

BRIEF DESCRIPTION OF THE DRAWINGS

This and other objects and features of the present invention will become apparent from the following description taken in conjunction with preferred embodiments thereof with reference to the accompanying drawings, in which.

DESCRIPTION OF THE PREFERRED EMBODIMENTS

Preferred embodiments of the present invention will now be discussed more in detail with reference to the accompanying drawings.

Figure 1:
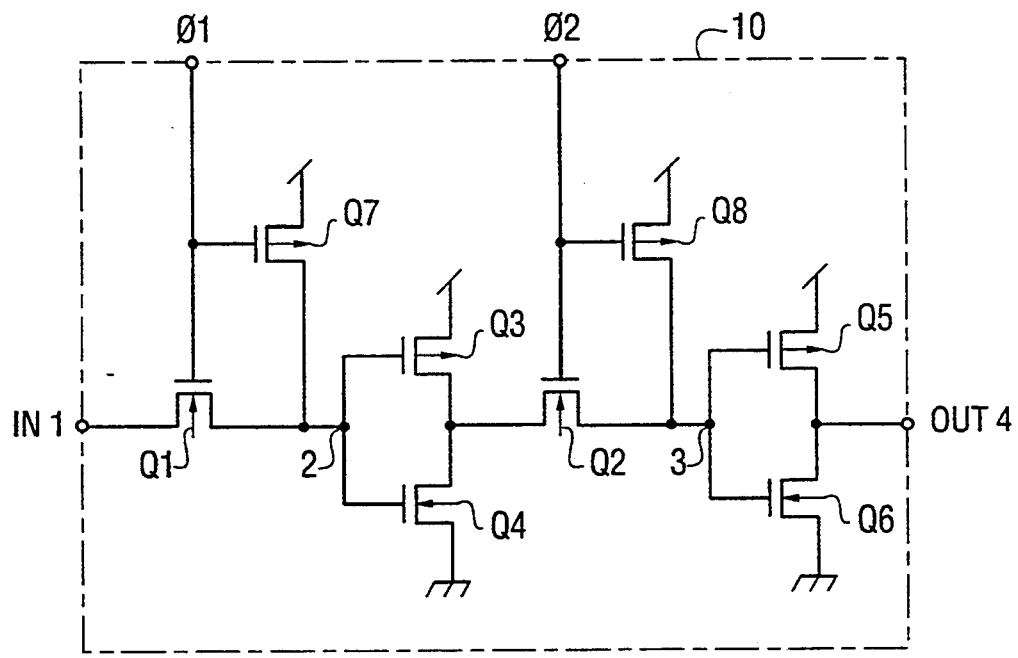
FIG. 1 is a circuit diagram of a dynamic circuit according to a first embodiment of the present invention.
Figure 5:
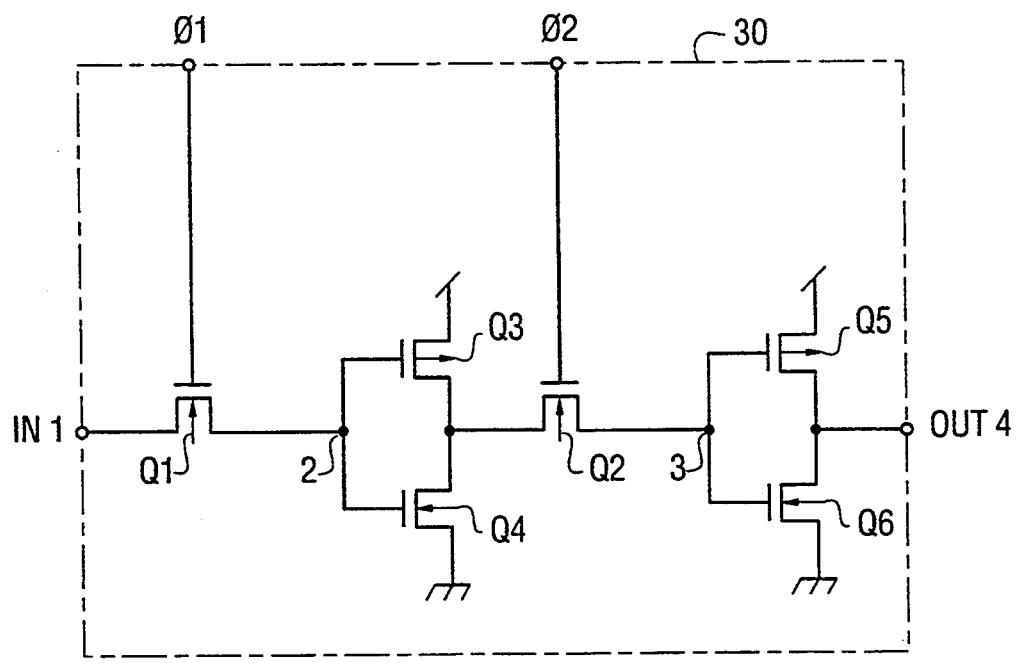
FIG. 5 is a circuit diagram of a conventional dynamic circuit.

Referring to FIG. 1, there is shown a circuit diagram of a two-phase dynamic MOS shift register according to a first embodiment of the present invention. In FIG. 1, reference numerals Q1 to Q6 indicate MOS transistors each of which is a fundamental element of one bit of the two-phase dynamic MOS shift register 10. $\phi1,\phi2$ are two-phase clock signals input to the dynamic circuits. IN1 is an input terminal. Gates of the transistors Q3,Q4 and Q5,Q6 are connected in common to respective nodes 2 and 3. OUT4 represents an output terminal.

According to the embodiment shown in FIG. 1, MOS transistors Q7,Q8 for switching use and constituting a switching circuit are included in the dynamic MOS shift register. Gates of the transistors Q7,Q8 are connected to the two-phase clock signal sources $\phi 1, \phi 2$, with drains thereof being connected to the power source ends, and sources thereof connected to the nodes 2,3, respectively.

In a static state, generally, the potential of each of clock signals $\phi 1$ and $\phi 2$ is "0" (low level). At this time, the transistors Q1 and Q2 are turned off as in the prior art if the transistors Q7,Q8 are not present, that is, the shift register is not electrically driven, resulting in a floating state. However, the dynamic MOS shift register of the present embodiment is provided with the transistors Q7 and Q8. Therefore, when the potential of each of clock signals $\phi 1$ and $\phi 2$ is "0" (low level) in the static state, the transistors Q7 and Q8 are in on state, whereby the potentials of nodes 2 and 3 are set at "1" (high level), respectively. Thus, the floating of gates is removed in the static state and the potential of each gate can be maintained constant.

Figure 2:
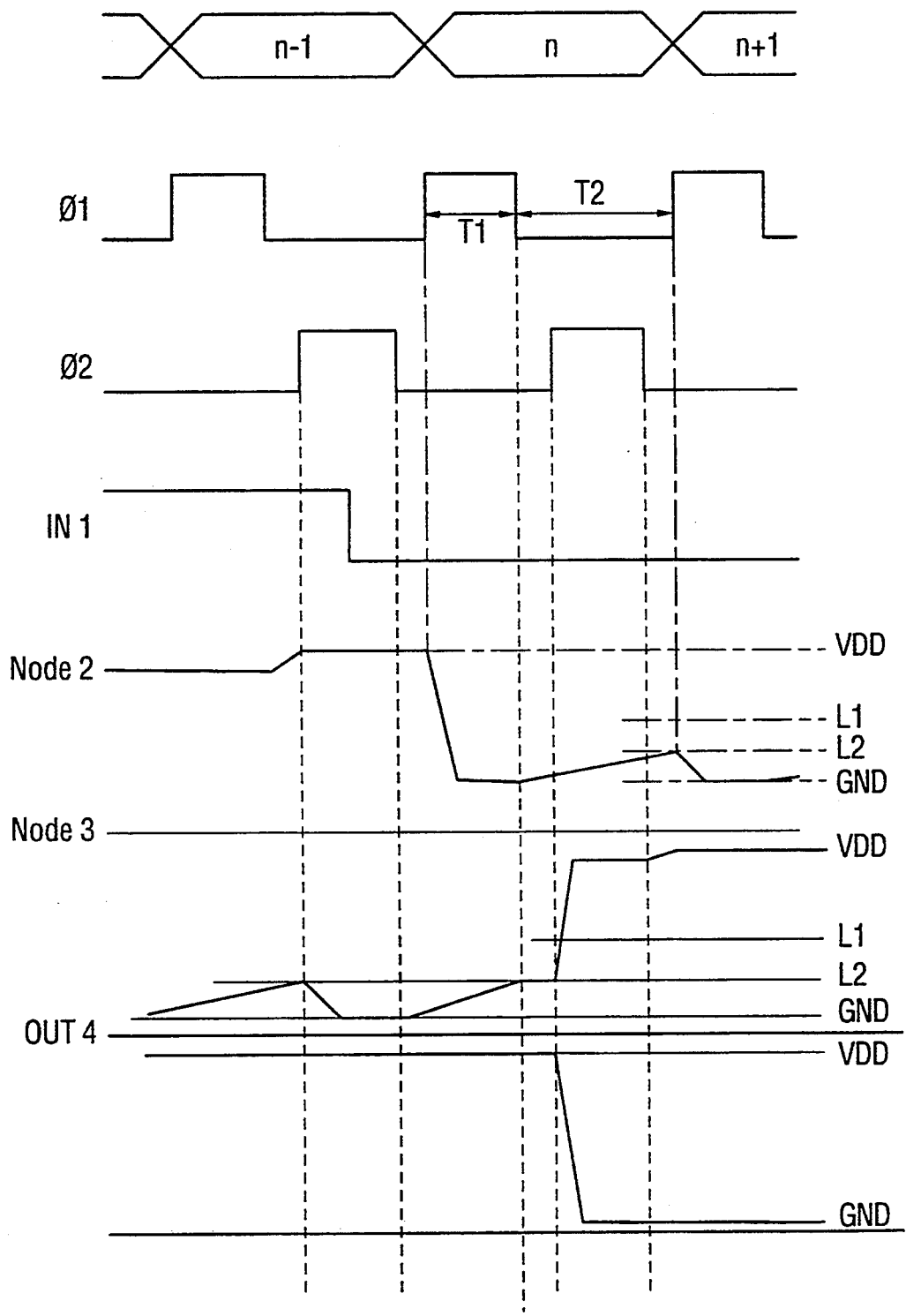
FIG. 2 is a time chart of signal waveforms in the dynamic circuit of FIG. 1.

FIG. 2 shows waveforms at each part of the dynamic MOS shift register of FIG. 1 during dynamic operation, which will be depicted below with reference to FIG. 1. In FIG. 2, n−1, n and n+1 indicate respective numbers of cycles, and $\phi 1, \phi 2$,IN1 and nodes 2 and 3 show corresponding waveforms of the potential. A high level period of each clock signal is denoted by T1, while a low level period is designated by T2. A level L1 indicates an input switching level of an inverter comprised of the transistors Q3 and Q4. Supposing that data "0" is previously written during the period T1 in the cycle n, then during the period T2 the transistor Q1 is turned off and the transistor Q7 is turned on since $\phi 1$ is in the low level during the period T2. In consequence, the potential of the node 2 begins to charge to a high level (VDD), but reaches only a maximum potential level L2 by the time the cycle n is changed to n+1. The size of the transistor Q7 is designed appropriately so that this maximum level L2 is sufficiently low as compared with the level L1, the switching level of the inverter Q3, Q4, considering the period T2. Transistor Q8 at node 3 is designed in a similar fashion. The circuit structure as above ensures normal and high-speed operation of the dynamic circuit. Moreover, the potential of each of nodes 2 and 3 can be settled in the high level (VDD) in the static state, making it possible to avoid the gate floating.

Figure 3:
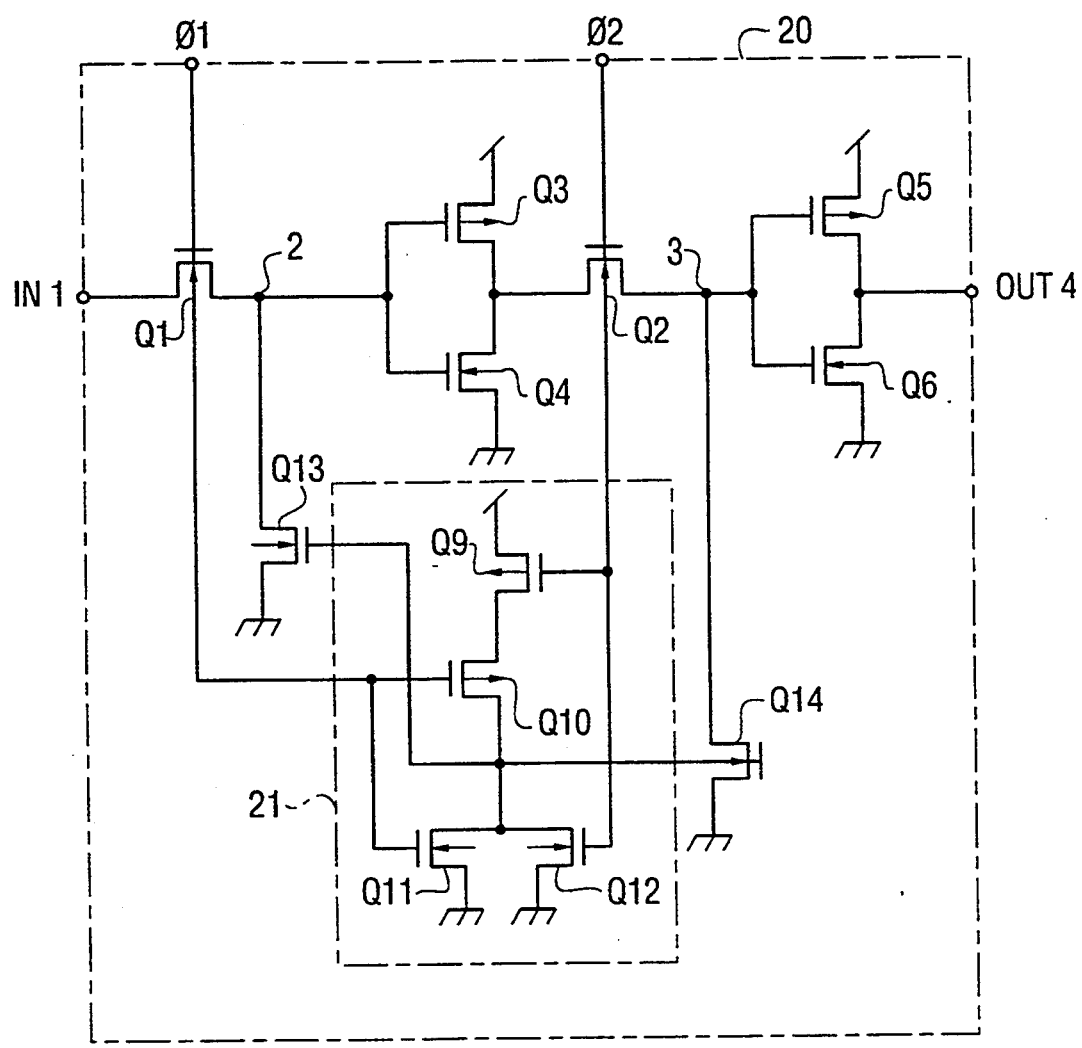
FIG. 3 is a circuit diagram of a dynamic circuit according to a second embodiment of the present invention.

FIG. 3 is a circuit diagram of a two-phase dynamic MOS shift register according to a second embodiment of the present invention. The parts of the second embodiment identical to those of the first embodiment are designated by the same reference numerals, and the detailed description thereof will be abbreviated here. The dynamic MOS shift register of the second embodiment is provided with a NOR circuit 21 which has gates of the MOS transistors Q1 and Q2 respectively receiving the two-phase clock signals $\phi 1$ and $\phi 2$ as inputs. The NOR circuit 21 consists of MOS transistors Q9 to Q12, an output of which is fed to switching MOS transistors Q13 and Q14 each constituting a switching circuit. Each of the transistors Q13 and Q14 has its drain connected to each of the nodes 2 and 3 and its source grounded to the earth. In a normal static state, the potential of each of clock signals $\phi 1$ and $\phi 2$ is "0" (low level) and an output of the NOR circuit 21 is "1". Accordingly, the transistors Q13 and Q14 are turned on, whereby the nodes 2 and 3 are brought to the grounding potential. Thus, the gate floating in the static state can be avoided in a simple circuit structure as above, thereby keeping the potential of each node constant.

Figure 4:
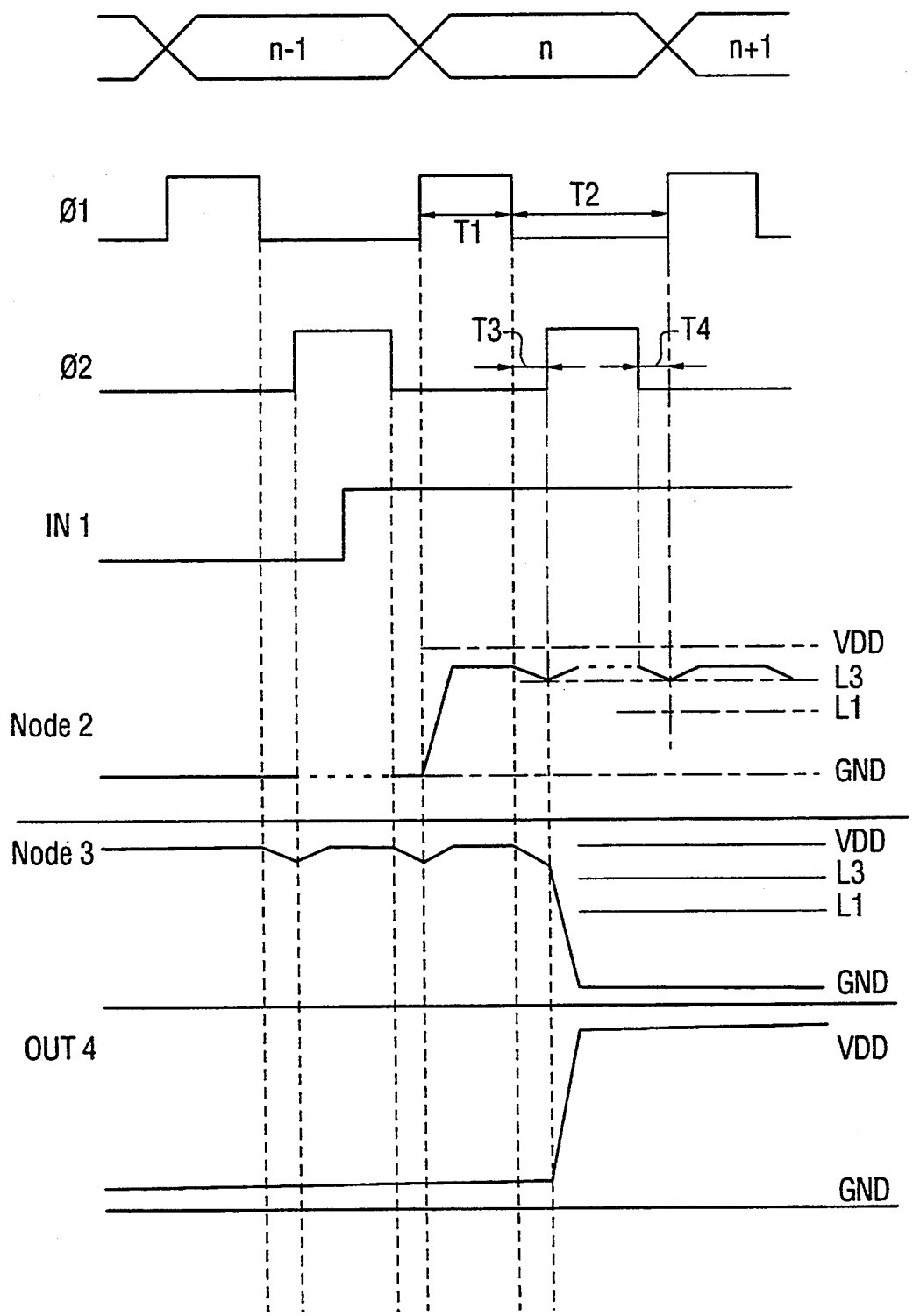
FIG. 4 is a time chart of signal waveforms in the dynamic circuit of FIG. 3.

FIG. 4 shows potential waveforms at each part of the two-phase dynamic MOS shift register of FIG. 3 during dynamic operation. In FIG. 4, n−1, n and n+1 indicate respective numbers of cycles, and $\phi 1$, $\phi 2$, IN1 and nodes 2 and 3 indicate waveforms of the potential at the corresponding parts of the shift register. A high level period of each clock signal is designated by T1, while a low level period thereof is indicated by T2. T3 and T4 indicate periods when both the clock signals $\phi 1, \phi 2$ are in the low level. A level L1 is an input switching level of an inverter comprised of the transistors Q3 and Q4. Assuming that data "1" (high) is previously written for the period T1 in the cycle n, then during the period T2 the transistor Q13 is turned on in the period T3 or T4 when both signals $\phi 1, \phi 2$ are in the low level within the period T2. As a result, the potential of the node 2 begins to discharge towards a low level (VSS), but reaches only the lowest potential level L3 by the time the cycle n is changed to n+1. The transistor Q13 is designed appropriately in size so that the lowest potential level L3 is sufficiently high compared to the level L1, the switching level of the inverter Q3, Q4, considering the period T3.

Likewise, the size of the transistor Q14 is designed to be optimum. Accordingly, it becomes possible to ensure normal and high-speed operation of the dynamic circuit, while settling the potential of each of the nodes 2 and 3 in the low level (GND) in the static state. Thus, the gate floating can be avoided.

The foregoing embodiments are an example of the circuit structure to realize the concept of the present invention. It is needless to say that the feature of the present invention may be realized by the other circuit structure and MOS transistor with the same function. Further, the potential of each node 2,3 in the above-discussed embodiments may be set as desired at either "0" (low) or "1" (high).

Further embodiments of the invention are possible. For example, the clock signals connected to the dynamic circuit and used to drive the switching circuits may be synchronized with an external clock signal that is input to the semiconductor integrated circuit device containing the dynamic circuit.

As is described hereinabove, according to the present invention, the semiconductor integrated circuit device including at least one gate-floating dynamic circuit in the static state is additionally provided with a simple and small-size circuit using a clock signal. Therefore, it becomes possible to measure the source current stably with good reproducibility since the floating of the gate can be easily avoided in the static state. Moreover, the source voltage of a chip can be prevented from decreasing due to a large quantity of current produced immediately after the power is supplied to the semiconductor integrated circuit device or the semiconductor integrated circuit device is rendered static when the clock is stopped. Besides, an increase of the gate area can be considerably restricted without deteriorating the simplicity of the circuit structure and high-speed operation of the dynamic circuit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor integrated circuit device comprising:
   (i) at least one two-phase dynamic MOS shift register having at least two switching devices which are connected in series and are each driven by one of a plurality of two-phase clock signals, respectively, such that when each one of said at least two switching devices is turned off its output becomes a floating state; and
   (ii) at least two switching circuits, whereby each of switching circuits is provided between each of said outputs of said at least two switching devices and a line having a constant potential,
   wherein each of said switching circuits is driven by one of said plurality of two-phase clock signals input to said two-phase dynamic MOS shift register, so as to secure an unsecured potential of each of said outputs of said at least two switching devices at a predetermined level.

2. The semiconductor integrated circuit device according to claim 1, wherein each of said switching circuits is comprised of an MOS transistor in which a gate of said MOS transistor is connected to one of said plurality of two-phase clock signals, a source thereof is connected to a power source and a drain thereof is connected to one of said outputs of said at least two switching devices.

3. A semiconductor integrated circuit device comprising:
   (i) at least one two-phase dynamic MOS shift register having at least two switching devices which are connected in series and are each driven by one of a plurality of two-phase clock signals, respectively, such that when each one of said at least two switching devices is turned off its output becomes a floating state;
   (ii) a NOR circuit; and
   (iii) a plurality of switching circuits, whereby each of switching circuits is provided between each of said outputs of said at least two switching devices and the output of said NOR circuit,
   wherein an input of said NOR circuit is driven by said plurality of two-phase clock signals so that said switching circuits secure an unsecured potential of each of said outputs of said at least two switching devices at a constant level.

4. The semiconductor integrated circuit device according to claim 3, wherein each of said switching circuits comprise an MOS transistor in which a gate of said MOS transistor is connected to the output of said NOR circuit, a drain thereof is connected to one of said outputs of said at least two switching devices, and a source thereof is grounded, so that when said MOS transistor is turned on, the unsecured potential of each of the outputs of said at least two switching devices is brought to ground.

5. A method of using switching circuits to secure an unsecured potential of outputs, of switching devices in semiconductor integrated circuit devices, whereby said semiconductor integrated circuit device comprises:
   (i) at least one two-phase dynamic MOS shift register having at least two of said switching devices which are connected in series and are each driven by one of a plurality of two-phase clock signals, respectively, such that when each one of said at least two switching devices is turned off its output becomes a floating state; and
   (ii) at least two of said switching circuits, whereby each of switching circuits is provided between each of said outputs of said at least two switching devices and a line having a constant potential,
   wherein each of said switching circuits is driven by one of said plurality of two-phase clock signals input to said two-phase dynamic MOS shift register, so as to secure an unsecured potential of each of said outputs of said at least two switching devices at a predetermined level.

6. The method according to claim 5, wherein each of said switching circuits is comprised of an MOS transistor in which a gate of said MOS transistor is connected to one of said plurality of two-phase clock signals, a source thereof is connected to a power source and a drain thereof is connected to one of said outputs of said at least two switching devices.

7. A method of using switching circuits to secure an unsecured potential of outputs of switching devices in semiconductor integrated circuit devices, whereby said semiconductor integrated circuit device comprises:
   (i) at least one two-phase dynamic MOS shift register having at least two of said switching devices which are connected in series and are each driven by one of a plurality of two-phase clock signals, respectively, such that when each one of said at least two switching devices is turned off its output becomes a floating state;
   (ii) a NOR circuit; and
   (iii) a plurality of said switching circuits, whereby each of switching circuits is provided between each of said outputs of said at least two switching devices and the output of said NOR circuit,
   wherein an input of said NOR circuit is driven by said plurality of two-phase clock signals, so that said switching circuits secure an unsecured potential of each of said outputs of said at least two switching devices at a constant level.

8. The method according to claim 7, wherein each of said switching circuits comprise an MOS transistor in which a gate of said MOS transistor is connected to the output of said NOR circuit, a drain thereof is connected to one of said outputs of said at least two switching devices, and a source thereof is grounded, so that when said MOS transistor is turned on, the unsecured potential of each of the outputs of said at least two switching devices is brought to ground.

9. A semiconductor integrated circuit device including at least two-phase dynamic MOS shift register have
   at least two first switching circuits which are connected in series and each driven by one of a plurality of two-phase clock signals, respectively;
   a plurality of second switching circuits each having a gate connected to an output of one of said at least two first switching circuits, said gate floating with an unsecured potential in a static state wherein said two-phase clock signals are secured at a predetermined potential; and
   a plurality of third switching circuits, each of which is connected between a line having a constant potential and the corresponding floating gate of each of said plurality of second switching circuits, each of said plurality of third switching circuits having a switching gate controlled by one of said two-phase clock signals, wherein said plurality of third switching circuits are switched on during said static state, thereby securing each of said floating gates of said plurality of second switching circuits at said constant potential of said line.

10. The semiconductor integrated circuit device according to claim 9, wherein each of said third switching circuits is comprised of an MOS transistor in which a gate of said MOS transistor is connected to one of said plurality of two-phase clock signals, a source thereof is connected to a power source, and a drain thereof is connected to one of said floating gates of said plurality of second switching circuits.

* * * * *